(12) United States Patent
Chang et al.

(10) Patent No.: US 9,617,367 B2
(45) Date of Patent: Apr. 11, 2017

(54) ALKALI-SOLUBLE RESIN AND METHOD FOR PREPARING THE SAME

(71) Applicant: BOE TECHNOLOGY GROUP CO., LTD., Beijing (CN)

(72) Inventors: Shan Chang, Beijing (CN); Zhuo Zhang, Beijing (CN); Xuelan Wang, Beijing (CN); Chen Tang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/428,542

(22) PCT Filed: Jun. 30, 2014

(86) PCT No.: PCT/CN2014/081204
§ 371 (c)(1),
(2) Date: Mar. 16, 2015

(87) PCT Pub. No.: WO2015/032239
PCT Pub. Date: Mar. 12, 2015

(65) Prior Publication Data
US 2016/0002381 A1    Jan. 7, 2016

(30) Foreign Application Priority Data

Sep. 9, 2013   (CN) .......................... 2013 1 0407054

(51) Int. Cl.
*C08F 220/06* (2006.01)
*C08F 220/18* (2006.01)
*C08F 224/00* (2006.01)
*G03F 7/004* (2006.01)

(52) U.S. Cl.
CPC .......... *C08F 224/00* (2013.01); *C08F 220/06* (2013.01); *C08F 220/18* (2013.01); *G03F 7/004* (2013.01)

(58) Field of Classification Search
CPC .............................. C08F 220/06; C08F 220/18
See application file for complete search history.

(56) References Cited

U.S. PATENT DOCUMENTS 6,225,408 B1 *   5/2001   Huang .................. C08F 290/04
                                                     525/111
2008/0023131 A1 *  1/2008   Pressley .................... C08F 2/50
                                                      156/273.7

FOREIGN PATENT DOCUMENTS

| CN | 1584638 A | 2/2005 |
| CN | 101046630 A | 10/2007 |
| CN | 101082772 A | 12/2007 |
| CN | 102221777 A | 10/2011 |
| CN | 103073668 A | 5/2013 |
| CN | 103467646 A | 12/2013 |
| JP | 2012230194 A | 11/2012 |

OTHER PUBLICATIONS

International Search Report dated Jun. 30, 2014 corresponding to application No. PCT/CN2014/081204.
First Office Action dated Feb. 13, 2014 of CN201310407054.5 corresponding to application No. PCT/CN2014/081204.

* cited by examiner

*Primary Examiner* — Robert Harlan
(74) *Attorney, Agent, or Firm* — Nath, Goldberg & Meyer; Joshua B. Goldberg; Tanya E. Harkins

(57) ABSTRACT

The present invention provides an alkali-soluble resin having good developing performance, which belongs to the technical field of polymer material, so as to solve the problem of the poor developing performance of the current alkali-soluble resin and the photosensitive composition made of the same; and a method for preparing the same. In the present invention, tetrahydrofuran groups (flexible functional group) is introduced into the alkali-soluble resin by highly reactive unsaturated monomer, which can improve the developing property of the alkali-soluble resin and can produce a photoresist film with a smooth surface and no corrosion on its side wall.

18 Claims, 1 Drawing Sheet

ALKALI-SOLUBLE RESIN AND METHOD FOR PREPARING THE SAME

This is a National Phase Application filed under 35 U.S.C. 371 as a national stage of PCT/CN2014/081204, filed Jun. 30, 2014, an application claiming the benefit of Chinese Application No. 201310407054.5, filed Sep. 9, 2013, the content of each of which is hereby incorporated by reference in its entirety.

FIELD OF THE INVENTION

The invention relates to the field of polymer materials, in particular to an alkali-soluble resin and a method for preparing the same.

BACKGROUND OF THE INVENTION

In flat panel display applications, a color filter as an important component in a display device directly impact the display effect, therefore the performance of the color photoresist is particularly important. The preparation process of the color filter typically includes coating, prebaking, exposing, developing, postbaking and the like. In the developing process, the developing is usually carried out by rinsing the photoresist after exposure with an alkaline developer; therefore the developing performance of the photoresist is an important factor in this process. If the developing performance of the photoresist is poor, large amount of time and energy will be consumed in the developing process, for example, extending the developing time or increasing the concentration of the developer. However, the use of a developer of high concentration will bring greater burden to the waste water treatment as well as the environment, and the aforementioned methods will result in decreased surface evenness of pixels and worse erosion of pixels' sidewall. The main functional component of the current photoresist is alkali-soluble resins, the performances of which affect the performances of the photoresist to a large extent.

SUMMARY

An object of the present invention is to provide an alkali-soluble resin having excellent developing performance, so as to solve the problem of the poor developing performance of the current alkali-soluble resin and the photosensitive composition made of the same.

The above technical problem is addressed by a technical solution of an alkali-soluble resin prepared by the polymerization of unsaturated carboxylic acid-based components which comprise an unsaturated carboxylic ester compound having a tetrahydrofuran group.

In the present invention, the tetrahydrofuran groups (flexible functional group) are introduced into the alkali-soluble resin by highly reactive unsaturated monomer, and dispersed in the rigid main chain of the alkali-soluble resin during the photo-initiated polymerization, thereby improving the flexibility of the alkali-soluble resin so as to further make the surface of the photoresist film prepared smoother. Meanwhile, the tetrahydrofuran groups have a stronger polarity, which can also improve the developing performance of the photoresist during the developing process, thereby achieving the photoresist film having a smooth surface, high developing performance and free of sidewall erosion.

Preferably, the alkali-soluble resin has a weight average molecular weight in the range of 8000 to 25000, an acid value in the range of 90 to 110, and a viscosity in the range of 100 to 160 mPa·s.

Preferably, the alkali-soluble resin is polymerized with the following raw materials: based on the total amount of the raw materials, 23-27% by mass of the unsaturated carboxylic acid-based components; 60-70% by mass of a solvent; 3-10% by mass of a initiator; 1-3% by mass of a molecular weight modifier.

The term "unsaturated carboxylic acid-based components" used herein includes an unsaturated carboxylic acid compound and an unsaturated carboxylic ester compound derived from the unsaturated carboxylic acid compound. Preferably, the unsaturated carboxylic acid-based components comprises: an unsaturated carboxylic acid compound, an unsaturated carboxylic alkyl ester compound, an unsaturated carboxylic ester compound having a benzene ring, and an unsaturated carboxylic ester compound having a tetrahydrofuran group.

Preferably, the unsaturated carboxylic acid compound is methacrylic acid or acrylic acid.

The term "unsaturated carboxylic alkyl ester compound" used herein does not have a benzene ring or a tetrahydrofuran group. In the unsaturated carboxylic alkyl ester compounds and its sub-categories (e.g., an unsaturated aliphatic carboxylic alkyl ester compound and an alkyl methacrylate described below) described herein, the alkyl group may be a linear, branched or cyclic alkyl group, and be substituted or unsubstituted. For example, it may be optionally substituted by hydroxy, vinyl, or epoxy group. The alkyl group may preferably have 1 to 12 carbon atoms.

The unsaturated carboxylic alkyl ester compound is preferably an unsaturated aliphatic carboxylic alkyl ester compound, and more preferably an alkyl methacrylate. The alkyl methacrylate may be at least one selected from methyl methacrylate, ethyl methacrylate, allyl methacrylate, butyl methacrylate (comprising n-butyl methacrylate, isobutyl methacrylate, tert-butyl methacrylate), isooctyl methacrylate, hydroxypropyl methacrylate, lauryl methacrylate, glycidyl methacrylate.

The "unsaturated carboxylic ester compound having a benzene ring" used herein does not have a tetrahydrofuran group. The benzene ring of the unsaturated carboxylic ester compound having a benzene ring may be derived from an unsaturated carboxylic acid having a benzene ring, such as phenyl acrylic acid (preferably 2-phenyl acrylic acid), or from an alcohol having a benzene ring, such as phenyl alkyl alcohol, wherein the alkyl group preferably has 1 to 3 carbon atoms, and more preferably benzyl alcohol). The compound is preferably an acrylate or methacrylate having one benzene ring, and more preferably 2-phenyl ethyl acrylate or benzyl methacrylate.

The tetrahydrofuran group of the unsaturated carboxylic ester compound having a tetrahydrofuran group may be derived from an alcohol having a tetrahydrofuran group, such as a tetrahydrofuran alkyl alcohol, wherein the alkyl group preferably has 1 to 2 carbon atoms; and more preferably tetrahydrofuran methanol. The compound is preferably an acrylate or methacrylate having one tetrahydrofuran group, and more preferably tetrahydrofurfuryl acrylate or tetrahydrofurfuryl methacrylate.

Preferably, the unsaturated carboxylic acid-based components comprises: 3 to 25% by mass of an unsaturated carboxylic acid compound, 10 to 80% by mass of an unsaturated carboxylic alkyl ester compound, 1 to 40% by mass of an unsaturated carboxylic ester compound having a benzene ring, and 5 to 25% by mass of an unsaturated carboxylic ester compound having a tetrahydrofuran group.

Preferably, the unsaturated carboxylic acid-based components comprises: 8 to 17% by mass of an unsaturated carboxylic acid compound, 35 to 65% by mass of an unsaturated carboxylic alkyl ester compound, 10 to 30% by mass of an unsaturated carboxylic ester compound having a benzene ring, and 8 to 15% by mass of an unsaturated carboxylic ester compound having a tetrahydrofuran group.

Preferably, said solvent is any one of ethyl acetate, acetone, benzene, toluene, xylene, dimethyl phthalate, cyclohexane, methylene dichloride, diethylene glycol monobutyl ether, propylene glycol monomethyl ether, propylene glycol monomethyl ether acetate, diethylene glycol butyl ether acetate, diethylene glycol diethyl ether, n-butyl ethoxyl acetate, n-butyl glycolate, n-butyl methoxyl acetate, and alkyl alkoxyl propionate.

Preferably, the initiator is any one of azo initiators, organic peroxide initiators, redox radical polymerizing initiator.

More preferably, the azo initiator is any one of azobisisobutyronitrile, azobisisoheptyronitrile, dimethyl azobisisobutyrate.

Preferably, the organic peroxide initiator is any one of benzoylperoxide, benzoylperoxide t-butyl ester, methyl ethyl ketone peroxide.

Preferably, the redox initiators include diacyl peroxide or persulfates, such as di benzoyl peroxide-dimethylaniline, persulfate-sulfite, or persulfate-ferrous salt.

Preferably, the molecular weight modifier includes any one of thiols, thiol esters, thioethers, xanthic acid derivatives.

Preferably, the thiol is a primary thiol having 5 to 14 carbon atoms, a secondary thiol having 5 to 14 carbon atoms, or a tertiary thiol having 5-14 carbon atoms;
the thiol ester is methyl thiol butyrate;
the thioether is n-dodecyl sulfide;
the xanthic acid derivative is phenethyl xanthates.

Another object of the present invention is to provide a method for preparing an alkali-soluble resin having a good developing property.

This object is achieved by a technical solution of a method for preparing an alkali-soluble resin, comprising the following steps:

Step 1, mixing unsaturated carboxylic acid-based components and a solvent and heating, and adding thereto an initiator to start a radical polymerization reaction at a constant temperature, thereby obtaining a reaction mixture;

Step 2, adding a molecular weight modifier into the reaction mixture so as to control the molecular weight of the polymer produced and terminating the polymerization, and then obtaining an alkali-soluble resin by heating, stirring while keeping the temperature, and filtering the reaction mixture.

Preferably, the alkali-soluble resin has a weight average molecular weight in the range of 8000 to 25000, an acid value in the range of 90 to 110, and a viscosity in the range of 100 to 160 mPa·s.

Preferably, the initiator is added within 5-20 min in Step 1;
the constant temperature of the radical polymerization in Step 1 is any temperature in the range of 60 to 110° C.;
the molecular weight modifier is added in 2 to 4 batches in Step 2; and the stirring time is 5 to 9 hours.

In the present invention, the tetrahydrofuran groups (flexible functional group) are introduced into the alkali-soluble resin by highly reactive unsaturated monomer, and dispersed in the rigid main chain of the alkali-soluble resin during the photo-initiated polymerization, thereby improving the flexibility of the alkali-soluble resin so as to further make the surface of the photoresist film prepared smoother. Meanwhile, the tetrahydrofuran groups have a stronger polarity, which can also improve the developing performance of the photoresist during the developing process, thereby achieving the photoresist film having a smooth surface, high developing performance and no sidewall erosion. In addition, developer with lower concentration can be used to achieve the developing since the alkali-soluble resin has higher developing property, thereby reducing the amount of the alkaline developer and thus reducing the intensity of waste liquid treatment which is friendlier to the environment.

DETAILED DESCRIPTION OF CERTAIN EMBODIMENTS

Figure 1:
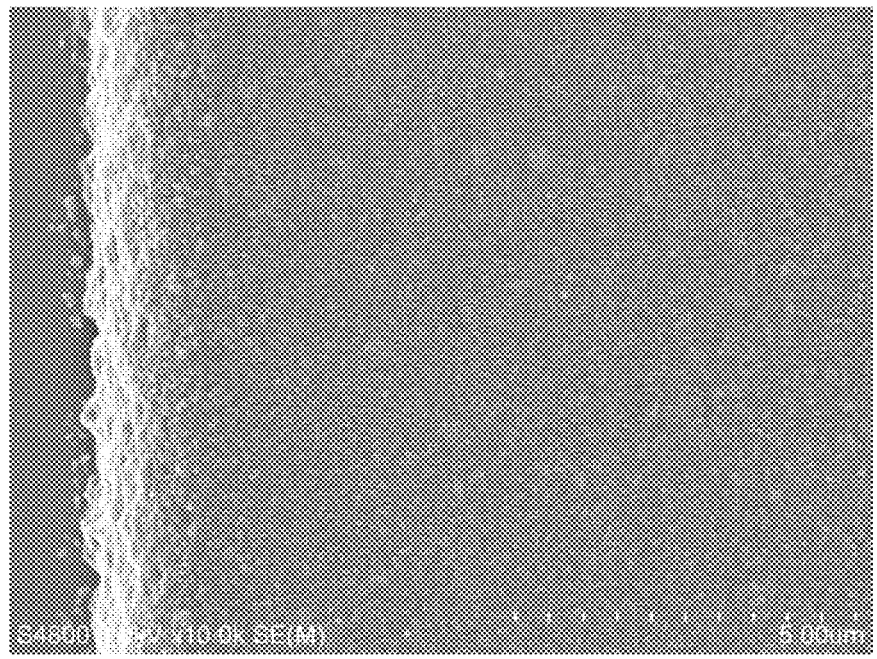
FIG. 1 is an image observed by a scanning electron microscopy showing the photosensitive resin composition prepared in comparative example after developing.

Embodiments of the present invention will be further described in detail, so that a person skilled in the art can get a better understanding of the technical solutions of the invention.

Herein, the molecular weights of the alkali-soluble resins are measured by Gel Permeation Chromatography (simply referred to as GPC), wherein Agilent LC1200 chromatograph (manufactured by Agilent Technologies) is used as a measurement apparatus. The specific measurement conditions are as follows: THF of HPLC grade as mobile phase, a flow rate of 1.0 mL/min, a sample concentration of 1 g/L, an injection volume of 20 µL, and a molecular weight calibration curve prepared by monodisperse polystyrene.

Herein, the acid values are measured by acidmeter Mettler s400 (manufactured by Mettler-Toledo).

Herein, the viscosities are measured at 23° C. and 60 rpm by viscosity meter NDJ-5S (manufactured by Shanghai Precision Instruments Co. Ltd.).

Hereinafter, unless noted otherwise, the reagents are all purchased from Sinopharm Chemical Reagents Co. Ltd.

Comparative Example

This comparative example provides an alkali-soluble resin prepared by the prior art, which was obtained by polymerization of the following raw materials: based on the total mass of the raw materials, 23% of unsaturated carboxylic acid-based components, 67% of ethyl acetate as a solvent, 9% of azodiisobutyronitrile as a initiator, and 1% of N-dodecyl mercaptan as a molecular weight modifier.

The unsaturated carboxylic acid-based components comprised, based on mass percentage, 8.7% of methacrylic acid as the unsaturated carboxylic acid compound, 70.6% of methyl methacrylate as the unsaturated carboxylic alkyl ester compound, and 20.7% of ethyl 2-phenylacrylate as the unsaturated carboxylic ester compound having a benzene ring.

The aforesaid alkali-soluble resin could be prepared by the method as follows:

Step 1, the constituents of the unsaturated carboxylic acid-based components were weighed according to the aforesaid proportions and added into a three-neck round-bottom flask, and then ethyl acetate as the solvent was added therein according to the aforesaid proportion; the mixture was heated until the system having a temperature of 100° C., and Propylene glycol methyl ether acetate solution of azodiisobutyronitrile as the initiator was added according to the aforesaid proportion using a constant pressure drop funnel in 10 minutes while keeping the temperature constant, thereby a reaction mixture was obtained.

Step 2, N-dodecyl mercaptan as the molecular weight modifier was added into the obtained reaction mixture in 3 batches, so as to control the molecular weight of the polymer produced and terminate the polymerization; the reaction system was heated to 110° C., and then was stirred for 5 hours while keeping the temperature; the resultant was cooled to room temperature and filtered, so as to obtain an alkali-soluble resin having weight average molecular weight of 8000, acid value of 100 and viscosity of 100 mPa·s.

Alternatively, the prepared alkali-soluble resin was used to produce a photosensitive resin composition (i.e. raw material of a photoresist) according to the following proportion: 18% of the alkali-soluble resin, 15% of red pigment with Index Number PR254 (Trade Name TDR-7, manufactured by DNS corporation), 25% of a dispersant resin (Trade Name BYK-2000, manufactured by BYK corporation), 12% of dipentaerythritol hexaacrylate (DPHA) monomers (manufactured by Cytec Industries Inc.), 2% of 2-benzyl-2-dimethylamino-1-[4-(4-morpholinyl)-phenyl]-1-butanone (Photoinitiator 369, manufactured by BASF corporation), 3% of novolac epoxy resin (Trade Name DEN438, manufactured by DOW Chemicals Inc.), 25% of propylene glycol methyl ether acetate (Trade Name PMA, manufactured by DOW Chemicals Inc.).

The above described components of the photosensitive resin composition and the amounts thereof were known in the prior art, and this photosensitive resin composition was used as a experimental comparative example only, therefore other components and amounts thereof may also be used.

The above photosensitive resin composition was coated on a glass substrate with a spin coater (rotation speed of 600 rpm) to form a photosensitive resin film; the film was prebaked at 100° C. for 2 min; the photosensitive resin film after prebaking treatment was exposed to ultraviolet light having an illuminance of 10 mw/cm² for 10 s; the film after exposure was developed by 0.042% and 0.021% by mass of KOH solution (manufactured by Henkel Inc. Germany, the KOH solutions used in the following examples are the same) respectively; and the developing time was recorded and shown in Table 1.

Further, the photosensitive resin film after developing treatment was observed by a scanning electron microscopy (SEM) to confirm the corrosion state (see FIG. 1) on the surface and side wall of the pixel formed from the photosensitive resin composition.

Example 1

This example provided an alkali-soluble resin which was polymerized by the following raw materials: based on the total mass of the raw materials, 23% of the unsaturated carboxylic acid-based components, 67% of ethyl acetate as a solvent, 9% of azodiisobutyronitrile as an initiator, and 1% of N-dodecyl mercaptan as a molecular weight modifier; and a method for preparing the same.

The unsaturated carboxylic acid-based components comprised, based on mass percentage, 8% of methacrylic acid as unsaturated carboxylic acid compound, 65% of methyl methacrylate as unsaturated carboxylic alkyl ester compound, 19% of ethyl 2-phenylacrylate as unsaturated carboxylic ester compound having a benzene ring, and 8% of tetrahydrofurfuryl methacrylate as unsaturated carboxylic ester compound having a tetrahydrofuran group.

The alkali-soluble resin could be prepared by the method as follows:

Step 1, the constituents of the unsaturated carboxylic acid-based components were weighed according to the aforesaid proportions and added into a three-neck round-bottom flask, and then ethyl acetate as the solvent was added according to the aforesaid proportion; the mixture was heated until the system having a temperature of 100° C., and Propylene glycol methyl ether acetate solution of azodiisobutyronitrile as the initiator was added according to the aforesaid proportion using a constant pressure drop funnel in 10 minutes while keeping the temperature constant; thereby a reaction mixture was obtained.

Step 2, N-dodecyl mercaptan as the molecular weight modifier was added into the obtained reaction mixture in 3 batches, so as to control the molecular weight of the polymer produced and terminate the polymerization; the reaction system was heated to 110° C., and then was stirred for 5 hours while keeping the temperature; the resultant was cooled to room temperature and filtered, so as to obtain an alkali-soluble resin having weight average molecular weight of 8000, acid value of 100 and viscosity of 100 mPa·s.

The prepared alkali-soluble resin was used to produce a photosensitive resin composition (i.e. raw material of a photoresist) according to the following proportion: 18% of the alkali-soluble resin, 15% of red pigment with Index Number PR254, 25% of a dispersant BYK-2000, 12% of dipentaerythritol hexaacrylate (DPHA) monomers, 2% of 2-benzyl-2-dimethylamino-1-[4-(4-morpholinyl)-phenyl]-1-butanone, 3% of novolac epoxy resin DEN438, 25% of propylene glycol methyl ether acetate.

The above photosensitive resin composition was coated on a glass substrate with a spin coater (rotation speed of 600 rpm) to form a photosensitive resin film; the film was prebaked at 100° C. for 2 min; the photosensitive resin film after prebaking treatment was exposed to ultraviolet light having an illuminance of 10 mw/cm² for 10 s; the film after exposure was developed by 0.042% and 0.021% by mass of KOH solution respectively; and the developing time was recorded and shown in Table 1. It could be seen from Table 1 that, compared with the photosensitive resin composition in the comparative example, the developing time of the photosensitive resin composition in this example was shortened significantly.

Figure 2:
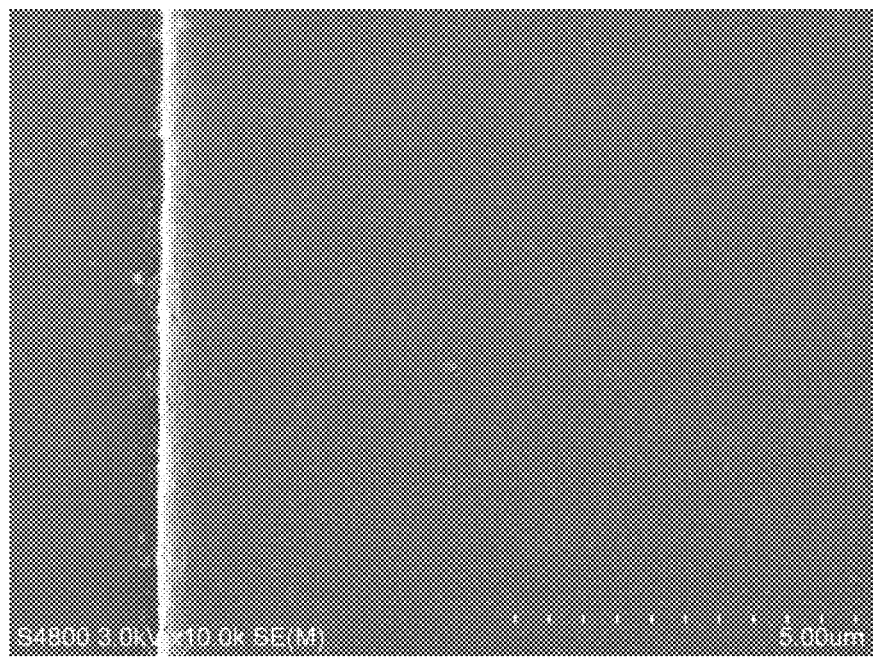
FIG. 2 is an image observed by a scanning electron microscopy showing the photosensitive resin composition prepared in example 1 after developing.

Further, the photosensitive resin film after developing treatment was observed by a scanning electron microscopy (SEM) to confirm the corrosion state (see FIG. 2) on the surface and side wall of the pixel formed from the photosensitive resin composition. It could be seen that, compared with the comparative example, there is no corrosion on the side wall of the pixel formed from the photosensitive resin composition in this example, and the surface of the pixel is relatively smooth; however, there is obvious corrosion on the side wall of the pixel in the comparative example. It could be seen that, the pixel formed from the photosensitive resin composition containing the alkali-soluble resin prepared in this example had many advantages, such as a smooth surface (which is a result of an enhanced flexibility of photosensitive resin composition), a tidy edge and less corrosion on its side wall, which could improve the display property of the pixel. Meanwhile, developer with lower concentration could be used to achieve the developing since the alkali-soluble resin exhibited higher developing property, thereby reducing the amount of the alkaline developer used and thus reducing the intensity of waste liquid treatment, and which was friendlier to the environment.

Example 2

This example provided an alkali-soluble resin which was polymerized by the following raw materials: based on the total mass of the raw materials, 25% of the unsaturated carboxylic acid-based components, 70% of benzene as a solvent, 3% of benzoyl peroxide as an initiator, and 2% of methyl thiobutyrate as a molecular weight modifier; and a method for preparing the same.

The unsaturated carboxylic acid-based components comprised, based on mass percentage, 3% of acrylic acid as unsaturated carboxylic acid compound, 80% of butyl methacrylate as unsaturated carboxylic alkyl ester compound, 1% of benzyl methacrylate as unsaturated carboxylic ester compound having a benzene ring, and 16% of tetrahydrofurfuryl acrylate as unsaturated carboxylic ester compound having a tetrahydrofuran group.

The aforesaid alkali-soluble resin could be prepared by the method as follows:

Step 1, the constituents of the unsaturated carboxylic acid-based components were weighed according to the aforesaid proportions and added into a three-neck round-bottom flask, and then benzene as the solvent was added according to the aforesaid proportion; the mixture was heated until the system having a temperature of 60° C., and Propylene glycol methyl ether acetate solution of benzoyl peroxide as the initiator was added according to the aforesaid proportion using a constant pressure drop funnel in 5 minutes while keeping the temperature constant, thereby a reaction mixture was obtained.

Step 2, methyl thiobutyrate as the molecular weight modifier was added into the obtained reaction mixture in 3 batches, so as to control the molecular weight of the polymer produced and terminate the polymerization; the reaction system was heated to 70° C., and then was stirred for 9 hours while keeping the temperature; the resultant was cooled to room temperature and filtered, so as to obtain an alkali-soluble resin having weight average molecular weight of 25000, acid value of 105 and viscosity of 120 mPa·s.

The prepared alkali-soluble resin was used to produce a photosensitive resin composition (i.e. raw material of a photoresist) according to the following proportion: 18% of the alkali-soluble resin, 15% of red pigment with Index Number PR254, 25% of a dispersant BYK-2000, 12% of dipentaerythritol hexaacrylate (DPHA) monomers, 2% of 2-benzyl-2-dimethylamino-1-[4-(4-morpholinyl)-phenyl]-1-butanone, 3% of novolac epoxy resin DEN438, 25% of propylene glycol methyl ether acetate.

The above photosensitive resin composition was coated on a glass substrate with a spin coater (rotation speed of 600 rpm) to form a photosensitive resin film; the film was prebaked at 100° C. for 2 min; the photosensitive resin film after prebaking treatment was exposed to ultraviolet light having an illuminance of 10 mw/cm$^2$ for 10 s; the film after exposure was developed by 0.042% and 0.021% by mass of KOH solution respectively; and the developing time was recorded and shown in Table 1. It can be seen from Table 1 that, compared with the photosensitive resin composition in the comparative example, the developing time of the photosensitive resin composition in this example was shortened significantly.

Example 3

This example provided an alkali-soluble resin which is polymerized by the following raw materials: based on the total mass of the raw materials, 24% of the unsaturated carboxylic acid-based components, 65% of methylene dichloride as a solvent, 8% of methyl ethyl ketone peroxide as an initiator, and 3% of n-dodecyl sulfide as a molecular weight modifier; and a method for preparing the same.

The unsaturated carboxylic acid-based components comprised, based on mass percentage, 25% of methacrylic acid as unsaturated carboxylic acid compound, 10% of ethyl methacrylate as unsaturated carboxylic alkyl ester compound, 40% of benzyl methacrylate as unsaturated carboxylic ester compound having a benzene ring, and 25% of tetrahydrofurfuryl methacrylate as unsaturated carboxylic ester compound having a tetrahydrofuran group.

The aforesaid alkali-soluble resin could be prepared by the method as follows:

Step 1, the constituents of the unsaturated carboxylic acid-based components were weighed according to the aforesaid proportions and added into a three-neck round-bottom flask, and then methylene dichloride as a solvent was added according to the aforesaid proportion; the mixture was heated until the system having a temperature of 110° C., and Propylene glycol methyl ether acetate solution of propylene glycol methyl ether acetate solution of methyl ethyl ketone peroxide as the initiator was added according to the aforesaid proportion using a constant pressure drop funnel in 20 minutes while keeping the temperature constant, thereby a reaction mixture was obtained.

Step 2, n-dodecyl sulfide as the molecular weight modifier was added into the obtained reaction mixture in 3 batches, so as to control the molecular weight of the polymer produced and terminate the polymerization; the reaction system was heated to 120° C., and then was stirred for 7 hours while keeping the temperature; the resultant was cooled to room temperature and filtered, so as to obtain an alkali-soluble resin having weight average molecular weight of 18000, acid value of 90 and viscosity of 140 mPa·s.

The prepared alkali-soluble resin was used to produce a photosensitive resin composition (i.e. raw material of a photoresist) according to the following proportion: 18% of the alkali-soluble resin, 15% of red pigment with Index Number PR254, 25% of a dispersant BYK-2000, 12% of dipentaerythritol hexaacrylate (DPHA) monomers, 2% of 2-benzyl-2-dimethylamino-1-[4-(4-morpholinyl)-phenyl]-1-butanone, 3% of novolac epoxy resin DEN438, 25% of propylene glycol methyl ether acetate.

The above photosensitive resin composition was coated on a glass substrate with a spin coater (rotation speed of 600 rpm) to form a photosensitive resin film; the film was prebaked at 100° C. for 2 min; the photosensitive resin film after prebaking treatment was exposed to ultraviolet light having an illuminance of 10 mw/cm$^2$ for 10 s; the film after exposure was developed by 0.042% and 0.021% by mass of KOH solution respectively; and the developing time was recorded and shown in Table 1. It can be seen from Table 1 that, compared with the photosensitive resin composition in the comparative example, the developing time of the photosensitive resin composition in this example was shortened significantly.

Example 4

This Example provided an alkali-soluble resin which is polymerized by the following raw materials: based on the total mass of the raw materials, 26% of the unsaturated carboxylic acid-based components, 66.5% of n-butyl ethoxyacetate as a solvent, 5% of azodiisobutyronitrile as an initiator, and 2.5% of phenethyl xanthate as a molecular weight modifier; and a method for preparing the same.

The unsaturated carboxylic acid-based components, based on mass percentage, comprised 17% of acrylic acid as unsaturated carboxylic acid compound, 40% of n-butyl methacrylate as unsaturated carboxylic alkyl ester compound, 38% of benzyl methacrylate as unsaturated carboxylic ester compound having a benzene ring, and 5% of tetrahydrofurfuryl methacrylate as unsaturated carboxylic ester compound having a tetrahydrofuran group.

The aforesaid alkali-soluble resin could be prepared by the method as follows:

Step 1, the constituents of the unsaturated carboxylic acid-based components were weighed according to the aforesaid proportions and added into a three-neck round-bottom flask, and then n-butyl ethoxyacetate as the solvent was added according to the aforesaid proportion; the mixture was heated until the system having a temperature of 80° C. and Propylene glycol methyl ether acetate solution of azodiisobutyronitrile as the initiator was added according to the aforesaid proportion using a constant pressure drop funnel in 12 minutes while keeping the temperature constant, thereby a reaction mixture was obtained.

Step 2, phenethyl xanthate as the molecular weight modifier was added into the obtained reaction mixture in 2 batches, so as to control the molecular weight of the polymer produced and terminate the polymerization; the reaction system was heated to 90° C., and then was stirred for 6 hours while keeping the temperature; the resultant was cooled to room temperature and filtered, so as to obtain an alkali-soluble resin having weight average molecular weight of 15000, acid value of 110 and viscosity of 160 mPa·s.

The prepared alkali-soluble resin was used to produce a photosensitive resin composition (i.e. raw material of a photoresist) according to the following proportion: 18% of the alkali-soluble resin, 15% of red pigment with Index Number PR254, 25% of a dispersant BYK-2000, 12% of dipentaerythritol hexaacrylate (DPHA) monomers, 2% of 2-benzyl-2-dimethylamino-1-[4-(4-morpholinyl)-phenyl]-1-butanone, 3% of novolac epoxy resin DEN438, 25% of propylene glycol methyl ether acetate.

The above photosensitive resin composition was coated on a glass substrate with a spin coater (rotation speed of 600 rpm) to form a photosensitive resin film; the film was prebaked at 100° C. for 2 min; the photosensitive resin film after prebaking treatment was exposed to ultraviolet light having an illuminance of 10 mw/cm$^2$ for 10 s; the film after exposure was developed by 0.042% and 0.021% by mass of KOH solution respectively; and the developing time was recorded and shown in Table 1. It can be seen from Table 1 that, compared with the photosensitive resin composition in the comparative example, the developing time of the photosensitive resin composition in this example was shortened significantly.

Example 5

This example provided an alkali-soluble resin which is polymerized by the following raw materials: based on the total mass of the raw materials, 27% of the unsaturated carboxylic acid-based components, 60% of diethylene glycol monobutyl ether as a solvent, 10% of azodiisoheptyronitrile as an initiator, and 3% of octyl mercaptan as a molecular weight modifier.

The unsaturated carboxylic acid-based components, based on mass percentage, comprised 10% of methacrylic acid as unsaturated carboxylic acid compound, 35% of isobutyl methacrylate as unsaturated carboxylic alkyl ester compound, 40% of ethyl 2-phenylacrylate as unsaturated carboxylic ester compound having a benzene ring, and 15% of tetrahydrofurfuryl acrylate as unsaturated carboxylic ester compound having a tetrahydrofuran group.

The aforesaid alkali-soluble resin could be prepared by the method as follows:

Step 1, the constituents of the unsaturated carboxylic acid-based components were weighed according to the aforesaid proportions and added into a three-neck round-bottom flask, and then diethylene glycol monobutyl ether as the solvent was added according to the aforesaid proportion; the mixture was heated until the system having a temperature of 90° C., and propylene glycol methyl ether acetate solution of azodiisoheptyronitrile as the initiator was added according to the aforesaid proportion using a constant pressure drop funnel in 17 minutes while keeping the temperature constant, thereby a reaction mixture was obtained.

Step 2, octyl mercaptan as the molecular weight modifier was added into the obtained reaction mixture in 3 batches, so as to control the molecular weight of the polymer produced and terminate the polymerization; the reaction system was heated to 100° C., and then was stirred for 6 hours while keeping the temperature; the resultant was cooled to room temperature and filtered, so as to obtain an alkali-soluble resin having weight average molecular weight of 20000, acid value of 98 and viscosity of 150 mPa·s.

The prepared alkali-soluble resin was used to produce a photosensitive resin composition (i.e. raw material of a photoresist) according to the following proportion: 18% of the alkali-soluble resin, 15% of red pigment with Index Number PR254, 25% of a dispersant BYK-2000, 12% of dipentaerythritol hexaacrylate (DPHA) monomers, 2% of 2-benzyl-2-dimethylamino-1-[4-(4-morpholinyl)-phenyl]-1-butanone, 3% of novolac epoxy resin DEN438, 25% of propylene glycol methyl ether acetate.

The above photosensitive resin composition was coated on a glass substrate with a spin coater (rotation speed of 600 rpm) to form a photosensitive resin film; the film was prebaked at 100° C. for 2 min; the photosensitive resin film after prebaking treatment was exposed to ultraviolet light having an illuminance of 10 mw/cm$^2$ for 10 s; the film after exposure was developed by 0.042% and 0.021% by mass of KOH solution respectively; and the developing time was recorded and shown in Table 1. It can be seen from Table 1 that, compared with the photosensitive resin composition in the comparative example, the developing time of the photosensitive resin composition in this example was shortened significantly.

TABLE 1 comparison table of the developing time of the photosensitive resin film

| No. | developing time with 0.042% developer | developing time with 0.021% developer |
|---|---|---|
| Example 1 | 15 s | 38 s |
| Example 2 | 13 s | 33 s |
| Example 3 | 18 s | 45 s |
| Example 4 | 12 s | 30 s |
| Example 5 | 20 s | 55 s |
| Comparative Example | 35 s | 80 s |

It can be understood that, the foregoing description of the embodiments has been provided for the purposes of illustrating the principles of the present invention, however the present invention is not limited to this. Obviously, many modifications and variations will be apparent to a person skilled in the art without departing from the spirit and essence of the present invention, and these modifications and variations also fall into the scope of the invention.

The invention claimed is:

1. An alkali-soluble resin prepared by the polymerization of unsaturated carboxylic acid-based components, wherein the unsaturated carboxylic acid-based components comprise an unsaturated carboxylic acid compound, an unsaturated carboxylic alkyl ester compound, an unsaturated carboxylic ester compound having a benzene ring, and an unsaturated carboxylic ester compound having a tetrahydrofuran group, wherein the unsaturated carboxylic alkyl ester compound does not have a benzene ring or a tetrahydrofuran group, and the alkyl group in the unsaturated carboxylic alkyl ester compound is optionally substituted by hydroxyl group, vinyl group, or epoxy group; the unsaturated carboxylic ester compound having a benzene ring does not have a tetrahydrofuran group.

2. The alkali-soluble resin according to claim 1, wherein the alkali-soluble resin has a weight average molecular weight of 8000 to 25000, an acid value of 90 to 110, and a viscosity of 100 to 160 mPa s.

3. The alkali-soluble resin according to claim 1, wherein the is alkali-soluble resin is polymerized with the following raw materials: based on the total amount of the raw materials, 23-27% by mass of the unsaturated carboxylic acid-based components; 60-70% by mass of a solvent; 3-10% by mass of a initiator; 1-3% by mass of a molecular weight modifier.

4. The alkali-soluble resin according to claim 1, wherein the unsaturated carboxylic acid compound is methacrylic acid or acrylic acid;
the unsaturated carboxylic alkyl ester compound is alkyl methacrylate, wherein the alkyl group in the alkyl methacrylate is optionally substituted by hydroxyl group, vinyl group, or epoxy group;
the unsaturated carboxylic ester compound having a benzene ring is ethyl 2-phenylacrylate or benzyl methacrylate; and
the unsaturated carboxylic ester compound having a tetrahydrofuran group is tetrahydrofurfuryl acrylate or tetrahydrofurfuryl methacrylate.

5. The alkali-soluble resin according to claim 4, wherein the alkyl methacrylate is at least one selected from methyl methacrylate, ethyl methacrylate, allyl methacrylate, n-butyl methacrylate, isobutyl methacrylate, tert-butyl methacrylate, isooctyl methacrylate, hydroxypropyl methacrylate, lauryl methacrylate and glycidyl methacrylate.

6. The alkali-soluble resin according to claim 1, wherein the unsaturated carboxylic acid-based components comprises 3 to 25% by mass of an unsaturated carboxylic acid compound, 10 to 80% by mass of an unsaturated carboxylic alkyl ester compound, 1 to 40% by mass of an unsaturated carboxylic ester compound having a benzene ring, and 5 to 25% by mass of an unsaturated carboxylic ester compound having a tetrahydrofuran group.

7. The alkali-soluble resin according to claim 6, wherein the unsaturated carboxylic acid-based components comprises 8 to 17% by mass of an unsaturated carboxylic acid compound, 35 to 65% by mass of an unsaturated carboxylic alkyl ester compound, 10 to 30% by mass of an unsaturated carboxylic ester compound having a benzene ring, and 8 to 15% by mass of an unsaturated carboxylic ester compound having a tetrahydrofuran group.

8. The alkali-soluble resin according to claim 3, wherein the solvent is any one of ethyl acetate, acetone, benzene, toluene, xylene, dimethyl phthalate, cyclohexane, methylene dichloride, diethylene glycol monobutyl ether, propylene glycol monomethyl ether, propylene glycol monomethyl ether acetate, diethylene glycol butyl ether acetate, diethylene glycol diethyl ether, n-butyl ethoxyl acetate, n-butyl glycolate, n-butyl methoxyl acetate, and alkyl alkoxyl propionate.

9. The alkali-soluble resin according to claim 3, wherein the initiator is a radical polymerizing initiator.

10. The alkali-soluble resin according to claim 9, wherein the radical polymerizing initiator is any one of azo initiators, organic peroxide initiators, redox radical polymerizing initiator.

11. The alkali-soluble resin according to claim 10, wherein the azo initiator is any one of azobisisobutyronitrile, azobisisoheptyronitrile, dimethyl azobisisobutyrate.

12. The alkali-soluble resin according to claim 10, wherein the organic peroxide initiator is any one of benzoylperoxide, benzoylperoxide t-butyl ester, methyl ethyl ketone peroxide.

13. The alkali-soluble resin according to claim 10, wherein the redox initiators comprise diacyl peroxide or persulfates.

14. The alkali-soluble resin according to claim 3, wherein the molecular weight modifier comprises any one of thiols, thiol esters, thioethers, xanthic acid derivatives.

15. The alkali-soluble resin according to claim 14, wherein the thiol is a primary thiol having 5 to 14 carbon atoms, a secondary thiol having 5 to 14 carbon atoms, or a tertiary thiol having 5-14 carbon atoms;
the thiol ester is methyl thiol butyrate;
the thioether is n-dodecyl sulfide; and
the xanthic acid derivative is phenethyl xanthate.

16. A method for preparing the alkali-soluble resin according to claim 1, wherein the method comprises the following steps:
Step 1, mixing the unsaturated carboxylic acid-based components and a solvent and heating, and adding thereto an initiator to start a radical polymerization reaction at a constant temperature, thereby obtaining a reaction mixture;
Step 2, adding a molecular weight modifier into the reaction mixture so as to control the molecular weight of the polymer produced and terminate the polymerization, and then obtaining the alkali-soluble resin by heating, stirring while keeping the temperature, and filtering the reaction mixture.

17. The method for preparing an alkali-soluble resin according to claim 16, wherein the alkali-soluble resin has a weight average molecular weight of 8000 to 25000, an acid value of 90 to 110, and a viscosity of 100 to 160 mPa s.

18. The method for preparing an alkali-soluble resin according to claim 16, wherein the initiator is added within 5-20 min in Step 1; and the constant temperature of the radical polymerization in Step 1 is any temperature in the range of 60 to 110° C.; the molecular weight modifier is added in 2 to 4 batches in Step 2; and the stirring time is 5 to 9 hours.

* * * * *